United States Patent [19]

Takasaki et al.

[11] Patent Number: 4,980,736

[45] Date of Patent: Dec. 25, 1990

[54] ELECTRIC CONVERSION DEVICE

[75] Inventors: Yukio Takasaki, Kawasaki; Kazutaka Tsuji, Hachioji; Tatsuo Makishima, Mitaka; Tadaaki Hirai, Koganei, all of Japan; Sachio Ishioka, Burlingame, Calif.; Tatsuro Kawamura; Keiichi Shidara, both of Tama, Japan; Eikyu Hiruma, Komae, Japan; Kenkichi Tanioka, Tokyo, Japan; Junichi Yamazaki, Kawasaki, Japan; Kenji Sameshima, Hachioji, Japan; Hirokazu Matsubara, Tokyo, Japan; Kazuhisa Taketoshi, Sagamihara, Japan

[73] Assignees: Hitachi, Ltd.; Nippon Hoso Kyokai, both of Tokyo, Japan

[21] Appl. No.: 155,809

[22] Filed: Feb. 16, 1988

[30] Foreign Application Priority Data

Mar. 23, 1987 [JP] Japan .................................. 62-65633
Mar. 23, 1987 [JP] Japan .................................. 62-65634

[51] Int. Cl.$^5$ ..................... H01L 27/14; H01L 31/00; H01L 45/00; H01L 47/02
[52] U.S. Cl. ............................................ 357/30; 357/4
[58] Field of Search ............................ 357/4, 30 K

[56] References Cited

U.S. PATENT DOCUMENTS

| | | | |
|---|---|---|---|
| 4,109,271 | 8/1978 | Pankove | 357/30 K |
| 4,117,506 | 9/1978 | Carlson et al. | 357/30 K |
| 4,231,049 | 10/1980 | Pearsall | 357/30 A |
| 4,258,375 | 3/1981 | Hsieh et al. | 357/30 A |
| 4,476,346 | 10/1984 | Tawada et al. | 357/2 |
| 4,476,477 | 10/1984 | Capasso et al. | 357/30 A |
| 4,481,523 | 11/1984 | Osaka et al. | 357/30 A |
| 4,490,573 | 12/1984 | Gibbons | 357/30 K |
| 4,499,331 | 2/1985 | Hamckawa et al. | 357/30 K |
| 4,591,893 | 5/1986 | Yamazaki | 357/30 K |
| 4,680,607 | 7/1987 | Fukatsu et al. | 357/30 K |
| 4,692,782 | 9/1987 | Seki et al. | 357/30 K |
| 4,718,947 | 1/1988 | Arya | 307/30 K |
| 4,728,370 | 3/1988 | Ishii et al. | 357/30 K |
| 4,736,234 | 4/1988 | Boulitroy et al. | 357/30 K |
| 4,761,680 | 8/1988 | Longeway et al. | 357/30 A |
| 4,784,702 | 11/1988 | Henri | 357/30 K |

FOREIGN PATENT DOCUMENTS

| | | | |
|---|---|---|---|
| 2545275 | 11/1984 | France | 357/30 K |
| 49-24619 | 3/1974 | Japan . | |
| 59-26154 | 1/1976 | Japan . | |
| 52-144992 | 12/1977 | Japan . | |
| 57-21876 | 2/1982 | Japan . | |
| 0204283 | 11/1984 | Japan | 353/30 K |
| 222383 | 10/1986 | Japan . | |
| 2135510 | 8/1984 | United Kingdom | 357/30 K |

OTHER PUBLICATIONS

Two et al. "Amorphous Silicon/Silicon Carbide Superlattice Avalanche Photodiodes" IEEE Transactions on Electron Devices pp. 1279–1283 vol. 35 No. 8, Aug. 1988.

Nishizawa et al., "Field-Effect Transistor Versus Analog Transistor (Statis Induction Transistor)" IEEE Transactions on Electron Devices vol. 22 No. 4 Apr. 1975 pp. 185–197.

Primary Examiner—Eugene R. Laroche
Assistant Examiner—Michael B. Shingleton
Attorney, Agent, or Firm—Antonelli, Terry, Stout & Kraus

[57] ABSTRACT

A photoelectric conversion device using an amorphous material composed mainly of tetrahedral elements including at least an element of hydrogen and halogens as semiconductor material is disclosed. When a strong electric field is applied to a layer formed by using this amorphous semiconductor, a charge multiplication effect is produced mainly in the interior of the amorphous semiconductor and thus it is possible to obtain a thermally stable photoelectric conversion device having a high sensitivity while keeping a good photoresponse.

41 Claims, 7 Drawing Sheets

ELECTRIC CONVERSION DEVICE

CROSS-REFERENCES TO RELATED APPLICATIONS

This application relates to U.S. application Ser. No. 69156, filed July 2, 1987, which is based on Japanese patent applications; No. 61-156317 filed July 4, 1986; No. 61-255671 filed Oct. 29, 1986; No. 61-255672 filed Oct. 29, 1986; No. 61-278635 filed Nov. 25, 1986; No. 62-4865 filed Jan. 14, 1987; No. 62-4867 filed Jan. 14, 1987; No. 62-4869 filed Jan. 14, 1987; No. 62-4871 filed Jan. 14, 1987; No. 62-4872 filed Jan. 14, 1987; No. 62-4873 filed Jan. 14, 1987; No. 62-4875 filed Jan. 14, 1987; and No. 62-149023 filed June 17, 1987.

BACKGROUND OF THE INVENTION

1. Field of the Invention

This invention relates to a photoelectric conversion device for converting light into electric signal and in particular to a photoelectric conversion device having a high sensitivity, utilizing the charge multiplication effect. Such photoelectric conversion device includes e.g. a photocell, a one-dimensional image sensor, a two-dimensional image sensor, an image pick-up tube, etc.

2. Description of the Related Arts

Heretofore, as photoelectric conversion elements, whose principal component is an amorphous semiconductor, there are known a photocell, a one-dimensional image sensor (e.g. JP-A- No. 52-144992), a two-dimensional image sensor combining a solid state drive circuit with an amorphous semiconductor (e.g. JP-B- No. 59-26154), a photoconductive image pick-up tube (e.g. JP-A- No. 49-24619), etc. Some of these photoconversion devices adopt a blocking type structure having a junction characteristic of preventing charge injection from the signal electrodes to the photoconductive layer and some others adopt a structure, by which charge is injected from one or both of the electrodes, a so-called injection type structure.

In an injection type element, since it is inherently possible to take-out charge carriers which are larger in number than the incident photons, a high sensitivity with a gain greater than 1 can be realized. In order to increase the sensitivity of the photoconversion element stated above, an imaging device has been proposed, in which a reading-out circuit and a photoconductive layer having e.g. phototransistor characteristics are overlaid upon each other (JP-A- No. 61-222383).

In order to achieve a similar object, a method utilizing an electrostatic induction type transistor as a device having a multiplication effect in its photoelectric converting portion itself has been proposed (JP-A- No. 57-21876) (IEEE Transactions on Electron Devices, Vol. ED 22, (1975) pages 185–197). There has been proposed also a method, by which a $p^+ \pi p n n^+$ structure is formed using an amorphous semiconductor, whose principal component is Si containing hydrogen and/or halogen (e.g. fluorine, chlorine, etc.), which structure is similar to that formed using crystalline Si, in which avalanche multiplication takes place in the depletion layer of its p-n junction portion in order to amplify signals. On the other hand, in the case where the blocking type structure having a characteristic of preventing charge injection from the exterior of the photoconductive layer is adopted, since only the portion of the incident light, which is converted into electric charge within the photoconductive layer, generates a signal current, the gain of the photoelectric conversion is always smaller than 1. However, it has been proposed by the inventors of this application that even a device of blocking type structure can have a photoelectric conversion efficiency greater than 1, if a method is adopted, by which a blocking type structure is formed by an amorphous semiconductor layer, whose principal component is Se and in which avalanche multiplication is made to occur in order to amplify signals (U.S. patent application Ser. No. 69156).

As described above, when the injection type structure is adopted for a photoelectric conversion device such as a photocell, a one-dimensional image sensor, a photoconductive layer piled-up type solid state photosensitive device, etc., since it is inherently possible to take-out charge carriers larger in number than the incident photons, a high sensitivity with a gain greater than 1 can be realized. However, by this method, by which a part of electric charge is injected in the interior of the sensor, the photoresponse is significantly deteriorated.

Further, in the case of the electrostatic induction type transistor, it was difficult to have uniform multiplication factors at a same value for different pixels, because an amplifying portion was integrated in each of the pixels.

On the other hand, in the example in which an amorphous semiconductor is used, since it is possible to form a homogeneous layer at a relatively low temperature and in addition the layer has a high resistivity, advantages can be obtained that no complicated pixel separation process as for crystalline Si is needed to realize a high resolution characteristic. However, for a photosensitive element, to which the avalanche multiplication phenomena in amorphous semiconductor are applied, there still remain several problematical points.

That is, by the method by which a $p^+ \pi p n n^+$ structure identical to that adopted for an avalanche diode made of a crystalline semiconductor is formed using amorphous Si in order to amplify signals, a signal light is projected through the $p^+$ region in the $\pi$ region, where it is absorbed and converted into electric charge, which is in turn led to the p-n junction portion, and the avalanche multiplication takes place in the depletion layer of the p-n junction portion. In order to cause the avalanche multiplication, it is necessary that electric charge travels over a distance longer than a certain value. The present inventors test-fabricated the structure stated above using amorphous Si, and confirmed that since localized states existing in the forbidden band were more numerous for amorphous Si than for crystalline Si, the depletion layer in the p-n junction portion did not satisfactorily extend, resulting in insufficient avalanche multiplication effect. Further, it was recognized that when the operating temperature exceeded room temperature, dark current was increased, and it was not possible to apply an electric field thereon, which was so high that a sufficient avalanche multiplication effect could be obtained. These results indicate that there was a problem that no satisfactorily high amplification factor could be obtained only by forming an avalanche diode structure similar to that in crystalline Si by using amorphous Si.

Furthermore, in the case of the avalanche multiplication method using amorphous Se having a blocking contact structure (i.e., structure which blocks carrier injunction from the associated electrode), although a large multiplication factor and a good photoresponse can be obtained, because of restrictions due to the material itself, e.g. in a high temperature environment over 80° C., there is a fear that the layer is altered during use and in particular there is a problem that element characteristics are unsatisfactory at high temperature operation.

SUMMARY OF THE INVENTION

An object of this invention is to provide a photoelectric conversion device having a good photoresponse, resolving the problematical points of the various techniques described previously.

Another object of this invention is to provide a photoelectric conversion device made of amorphous semiconductor, which has a good thermal stability and whose photoelectric conversion efficiency is greater than 1.

Still another object of this invention is to provide a photoelectric conversion device having low dark current.

Still another object of this invention is to provide a photoelectric conversion device, for which a uniform photoelectric converting portion having a large area can be easily formed.

Still another object of this invention is to provide a photoelectric conversion device, which can be fabricated by a simple process.

In order to achieve these objects a photoelectric conversion device according to this invention is characterized in that it comprises a substrate; a first electrode formed on said substrate; a photoconductive layer for converting incident light into signal carriers, being formed on said first electrode, and having an amorphous semiconductor layer which is made mainly of at least one first element belonging to tetrahedral system and contains at least one second element selected from element group consisting of hydrogen and halogens; a means for applying electric field to said photoconductive layer, making said carriers run through said photoconductive layer and multiplying said carriers in said amorphous semiconductor layer.

According to this invention it is possible to obtain a photoelectric conversion device having a high sensitivity with a photoconductive gain greater than 1 and good thermal stability without reducing the excellent photoresponse of a photosensitive element using a photoconductive layer of blocking type structure.

DESCRIPTION OF THE PREFERRED EMBODIMENTS

The inventors of this invention had already discovered that a charge multiplication takes place in an amorphous semiconductor layer made mainly of Se, when a strong electric field is applied to the amorphous semiconductor layer. Heretofore, it is generally thought that such phenomena hardly occur in an amorphous semiconductor layer itself, because there are a number of internal defects in the layer, and it has been believed that the amorphous Se is an exceptional material.

This time, the inventors have found that the material, in which the phenomena described above takes place, are not restricted to amorphous Se, but the blocking contact structure can be formed by using a tetrahedral amorphous material stated above containing hydrogen or halogens and further that the charge multiplication can be produced also mainly in the interior of a tetrahedral amorphous semiconductor layer just as in Se by adopting the blocking type structure described above and driving it while applying a high voltage to an inner region of the amorphous layer having no junction depletion region, contrarily to the prior art method by which a p-n junction is formed in such an amorphous silicon and the avalanche multiplication is made to occur in the depletion region of the junction portion. As an element of the tetrahedral system, carbon, silicon, germanium and tin can be used. By using this method, by which the charge multiplication action is made to take place in an amorphous semiconductor layer while applying a strong electric field to the amorphous semiconductor layer, it is possible to obtain a photoelectric conversion device having a high sensitivity with a photoconductive gain greater than 1 without reducing the excellent photoresponse of the photosensitive element having the blocking type structure.

As a result of examining these phenomena more in detail, it has been found that the characteristics are not deteriorated even for the temperatures higher than 80° C. and that the stability at the high temperature operation is especially excellent, if a material having a forbidden band width greater than 1.85 eV is used as the tetrahedral amorphous semiconductor material forming the blocking type structure described above.

Further, it has been found that a satisfactory multiplication factor can be obtained, if the amorphous layer is about 0.5 to 10 $\mu$m thick.

Figure 1A:
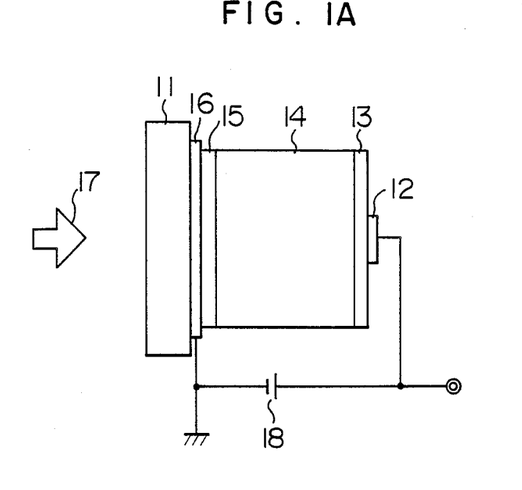
FIGS. 1A and 1B are schemes illustrating examples of the basic construction of this invention.

FIG. 1A shows an example of the basic construction of a photoelectric conversion device for realizing this invention. A transparent substrate 11; a transparent electrode 16, whose thickness is not greater than 300 nm; a blocking layer 15 about 5 to 500 nm thick; a photoconductive layer 14 about 0.5 to 10 $\mu$m thick containing amorphous semiconductor having the charge multiplication effect; a blocking layer 13 about 5 to 500 nm thick, which prevents injection of charge carriers, whose polarity is opposite to that of those blocked by the blocking layer 15; a counter electrode 12 and a power source 18 are fundamental portions thereof. Reference numeral 17 denotes an incident light. However, in this construction, the blocking layer 13 or 15 may be omitted, if a satisfactory rectifying contact can be obtained between the photoconductive layer 14 and the electrode 12 or the electrode 16.

To the photoelectric conversion device having the construction indicated in FIG. 1A an electric field necessary for realizing the avalanche multiplication in the amorphous semiconductor layer is applied by the power source 18. As the inventors of this invention have discovered, in a device according to this invention, in which the amorphous semiconductor layer (although it is not shown in the figure, it must constitute at least a part of the photoconductive layer 14) is made of a material belonging to the tetrahedral system containing hydrogen or halogens and forms a blocking type structure, it is possible to apply a high electric field over the whole amorphous semiconductor layer and further to keep dark current at a value, which is smaller than 1/100 of that in a crystalline semiconductor, inspite of its large area.

In this state, when it is irradiated with light on the transparent electrode 16 side, incident light is absorbed within the amorphous semiconductor layer so as to generate electron-hole pairs, which travel in the directions determined by the polarity of the applied electric field, opposite to each other. Consequently, if the thickness of the amorphous semiconductor layer and the direction of the electric field are so set that charge carriers having a larger ionization ratio between photogenerated electrons and holes for the adopted amorphous semiconductor run through the amorphous semiconductor layer under the high electric field so that the charge multiplication is realized with a high efficiency, it is possible to obtain a device characteristic of operating stably with a high sensitivity with a photoconductive gain greater than 1 even for the temperatures higher than 80° C., maintaining the high speed photoresponse. For example, in the construction in FIG. 1A, it is mainly electrons that travel through the photoconductive layer 14 (amorphous semiconductor layer).

Furthermore, an amorphous semiconductor can be easily formed in a homogeneous and large thin layer and it is possible to deposit it on arbitrary substrate by a simple process. Consequently, from the view point that a uniform multiplication factor can be obtained, it can be understood that this invention is very useful.

As the tetrahedral amorphous semiconductor material, which is preferable for realizing this invention, compounds composed mainly of Si can be cited. These compounds have a feature that their band gap can be varied by varying fabrication conditions or the composition ratio of Si and that they are excellent in the thermal stability property.

Further, the charge multiplication phenomena are observed also in amorphous materials composed mainly of the compound of carbon and silicon (silicon carbide) containing hydrogen and/or halogens. The content of the added element of hydrogen or halogens is preferably 0.5-30 at. % and more preferably 5-20 at. %. This amorphous material is more excellent in the thermal stability with respect to Se and has in general a wider forbidden band and fewer thermally excited carriers with respect to amorphous Si. For these reasons, it has a smaller increase in dark current even at the high temperature operation. Further, with the material described above, since the forbidden band width can be easily varied by varying the composition ratio of carbon and silicon, it is possible to choose a material having the forbidden band width optimum for the utilization conditions and therefore the material is extremely useful. In this way, also with an amorphous semiconductor mainly composed of silicon carbide it is possible to resolve the problem at the high temperature operation, which is characteristic to a multiplication type imaging device using amorphous Se.

The inventors of this invention have examined the avalanche multiplication in amorphous silicon carbide more in detail and found that amorphous silicon carbide with forbidden band width of 1.9 to 2.6 eV can be obtained for carbon composition ratio between 5 and 50%, and in such material, avalanche multiplication occurs efficiently, and that the thickness of the amorphous silicon carbide is preferably not less than 0.5 $\mu$m in order to obtain a satisfactory multiplication factor.

Further, a small amount of elements of V family such as P, As, etc. or elements of III family such as B, Al, etc. may be added to amorphous silicon carbide for obtaining an avalanche multiplication layer. But, in this case, it is desirable to keep the resistivity at the room temperature over $10^{10}$ $\Omega$cm.

Figure 9:
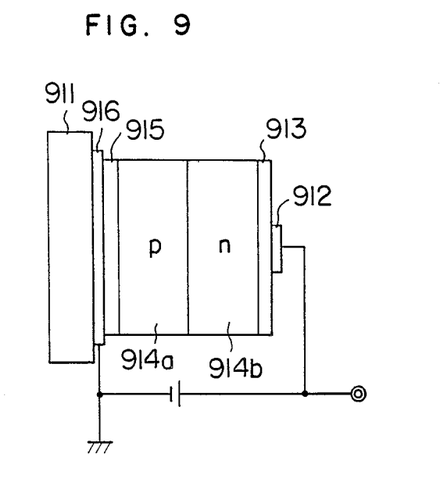
FIG. 9 is a scheme for explaining the structure of still another embodiment of the photoelectric conversion device according to this invention.

Furthermore, the amorphous silicon carbide layer is not necessarily simply a homogeneous layer, but, in particular, in the case of a-SiC, a p-n junction may be formed therein, in order to have a structure, in which an avalanche multiplication can be produced efficiently in the junction portion, or the charge multiplication factor may be increased effectively by controlling the forbidden band width while varying the carbon concentration in the direction of the layer thickness. A device having a p-n junction in the amorphous silicon carbide layer is shown in FIG. 9. In this figure, 911 is a transparent substrate; 916 a transparent electrode, 915 an electron blocking layer, 914a a p-type amorphous silicon carbide layer portion (doped with B), 914b an n-type amorphous silicon carbide layer portion (doped with P), 913 a hole blocking layer, an 912 and Al electrode.

Figure 1B:
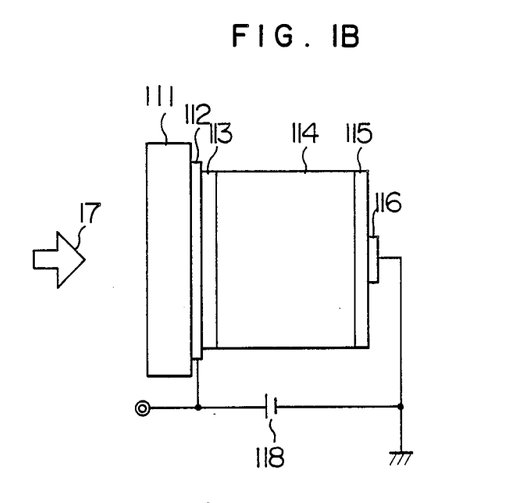

By the way, in the structures indicated in FIGS. 1A and 1B, in the case where the carrier blocking characteristic is intensified by disposing the blocking layers 13, 15, the layer described below is useful.

That is, as the hole blocking layer, 113, amorphous silicon carbide or silicon nitride containing at least one of hydrogen and halogens, or n conductivity type amorphous silicon carbide or silicon nitride containing at least one of hydrogen and halogens and at least one of the element of V family such as P, As, etc., or oxide of at least one of Ce, Ge, Zn, Cd, Al, Si, Nb, Ta, Cr and W, or a combination of more than 2 of the layers described above is suitable.

Further, as the electron blocking layer, 115, amorphous silicon carbide or silicon nitride containing at least one of hydrogen and halogens, or p conductivity type amorphous silicon carbide or silicon nitride containing at least one of hydrogen and halogens and at least one of the elements of III family such as B, Al, etc., or oxide of Ir, or at least one of calcogenides such as $Sb_2S_3$, $As_2S_3$, $As_2Se_3$, Se-As-Te, etc., or a combination of more than 2 of the layers described above is suitable.

Here, for the silicon carbide used as the carrier blocking layer, contrarily to the silicon carbide used as the charge multiplication layer, the carbon content may be varied to a value greater than 50% depending on the sign of the carrier (i.e. electron or hole), whose injection should be blocked.

Although a photoelectric conversion device using the charge multiplication effect in a tetrahedral amorphous semiconductor layer has been described above, for an amorphous semiconductor, contrarily to a crystal, since it is possible to overlay arbitrary different materials upon one another, the photoconductive layer may be constituted not by a single layer, but together with other thermally stable amorphous semiconductor layers overlaid thereon and having a similar charge multiplication. In addition, the whole photoconductive layer is not necessarily amorphous semiconductor, but it may have a construction, in which a crystalline semiconductor layer such as Si, etc. and an amorphous semiconductor layer are overlaid on each other. Further, it may be so constructed that it is deposited on a substrate including signal reading-out circuits, etc. What is essential to this invention is that there is disposed an amorphous semiconductor layer composed mainly of an element belonging to the tetrahedral system containing at least one of hydrogen and halogens as at least some of the layers constituting the photoconductive layer, and in which the charge multiplication is made to occur so as to enhance the sensitivity. Consequently, it is also possible that it is mainly the other layers in the photoconductive layer that have the function to absorb the incident light so as to produce photocarriers and that the amorphous semiconducting layer is used mainly for multiplying the carriers. In this case, there is a layer for generating photocarriers on the side, which is exposed to the incident light, in the photoconductive layer and the amorphous semiconductor layer may be made therebehind (in the direction of the propagation of the incident light).

Figure 2:
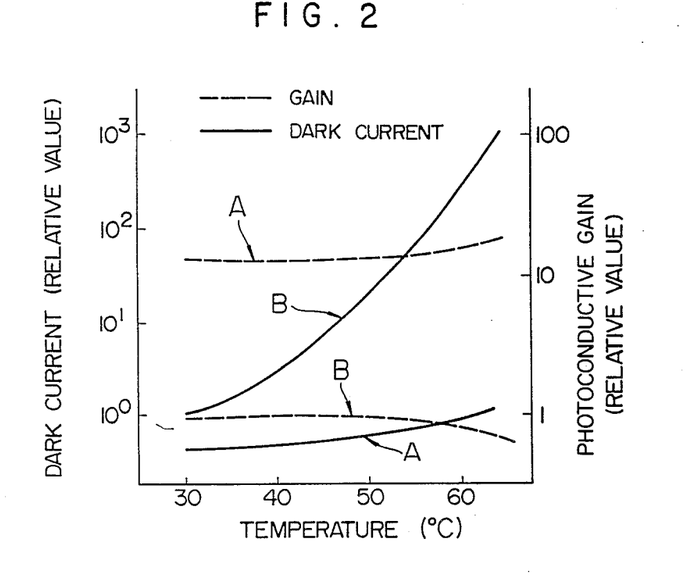
FIGS. 2 and 3 are graphs explaining characteristics and the defective fraction, respectively, of a device according to this invention and another device.

FIGS. 2 and 3 indicate effects obtained by realizing this invention. FIG. 2 indicates the temperature dependence of the dark current and the photoconductive gain when two photosensitive elements (A) of this invention and (B) of the prior art are driven by applying such an electric field that an avalanche multiplication can occur. Photosensitive element (A) consists of the transparent electrode 112, the hole blocking layer 113, the intrinsic amorphous silicon layer as photoconductive layer 114, the electron blocking layer 115 and Al as electrode 116 successively deposited on the transparent glass substrate 111, as indicated in FIG. 1B, and has an effective area of 1 cm$^2$. Photosensitive element (B) has a p$^+$ $\pi$ pn junction, and has an amorphous silicon layer disposed on a transparent electrode deposited on a transparent substrate and Al electrode deposited thereon, and has an effective area of 1 cm$^2$. With the photosensitive element (B), the gain is insufficient in all temperature regions and the dark current increased significantly with increasing temperature, while both the gain and the dark current of the photosensitive element (A) have satisfactory behavior.

Figure 3:
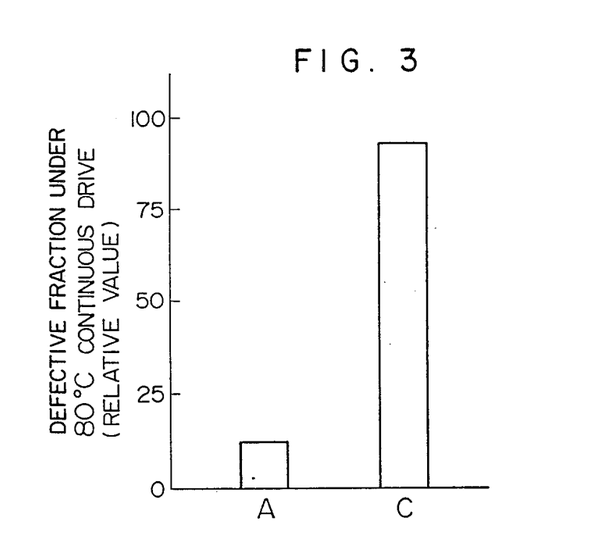

FIG. 3 indicates the endurance of the element (A) described above and an element (C) driven continuously for 100 hours at 80° C., the element (C) consisting of a transparent electrode, a hole blocking layer, an amorphous Se layer and an Au electrode successively deposited on a transparent substrate and having an effective area of 1 cm$^2$. The endurance of the element (A) is remarkably improved with respect to that of the element (C). In the case where silicon carbide is used as the amorphous semiconductor, effects similar to those indicated in FIGS. 2 and 3 can be obtained.

Although, in the above, examples in which the avalanche effect in a thermally stable tetrahedral amorphous semiconductor is applied mainly to a photoelectric conversion device have been described, it is a matter of course that this invention can be applied as well to more general amplifying elements and switching elements apart from photoelectric conversion devices.

Hereinbelow, this invention will be explained more in detail by using examples.

EXAMPLE 1

The example 1 will be explained referring to FIG. 1A.

A transparent electrode 16 composed mainly of iridium oxide is formed on a transparent substrate 11. An a-Si:H having a layer thickness of 0.5–10 μm is formed thereon as a photoconductive layer 14 including amorphous semiconductor by the plasma CVD method by using SiH$_4$ as source gas. Further, an a-SiC:H having a layer thickness of 10 nm, doped with P at 50 ppm, is formed thereon as a hole blocking layer 13 by using SiH$_4$ and C$_2$H$_6$ as source gases and PH$_3$ as doping gas. A photoelectric conversion device is obtained by depositing an Al as electrode 16 as a counter electrode further thereon.

EXAMPLE 2

Figure 4A:
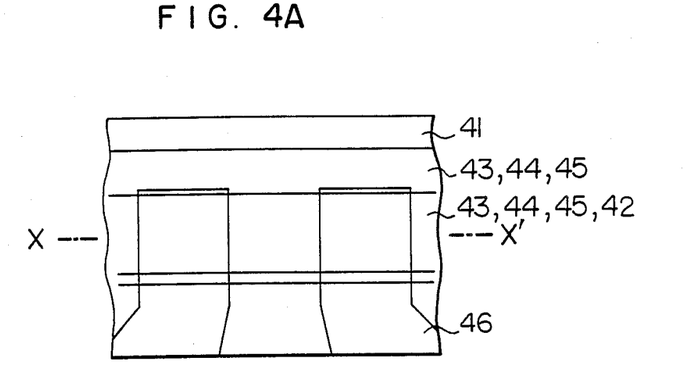
FIGS. 4A and 4B are schemes for explaining the structure of a one-dimensional image sensor, which is an embodiment of the photoelectric conversion device according to this invention.
Figure 4B:
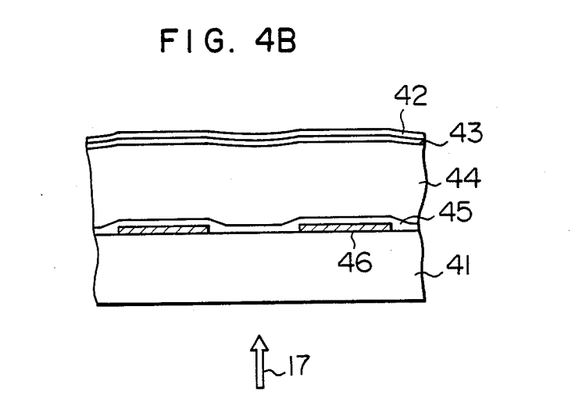

FIGS. 4A and 4B indicate the construction of a one-dimensional image sensor, which is an embodiment of this invention. FIG. 4A is a plan view showing a part thereof and FIG. 4B is a cross-sectional view along the XX' line in FIG. 4A.

A transparent conductive film composed mainly of iridium oxide is deposited on a transparent substrate 41. Then the conductive film is separated into a plurality of portions by the photoetching so as to form individual reading-out electrodes 46. An a-SiC:H having a layer thickness of 10 nm, doped with B at 50 ppm, is formed thereon as an electron blocking layer 45 by means of a mask by using SiH$_4$ and C$_2$H$_6$ as source gases and B$_2$H$_6$ as doping gas. An a-Si:H having a layer thickness of 0.5–10 μm is formed further thereon as a photoconductive layer 44 containing amorphous semiconductor by means of the same mask by sputtering an Si target, using a mixed gas of Ar and H$_2$. An a-SiC:H having a layer thickness of 10 nm, doped with P at 50 ppm, is formed further thereon as a hole blocking layer 43 by means of the same mask by using SiH$_4$ and C$_2$H$_6$ as source gases and PH$_3$ as doping gas. Al is deposited further thereon as a common electrode 42 by means of a mask different from that described above. Thereafter, the reading-out electrodes 46 are connected to a scanning circuit disposed on the substrate by a method such as bonding, etc. so as to obtain a one-dimensional image-sensor.

In the case where an electric field higher than $5 \times 10^7$ V/m is applied to the photoelectric conversion device of the example 1 or 2 so that the transparent substrate 11, 41 side is negative with respect to the counter electrode 12, 42 and incident light 17 is projected to the transparent substrate 11, 41, a high sensitivity with a gain greater than 1 can be realized without impairing the photoresponse. Further, even in the case where it is driven continuously for a long time at 80° C., no degradations in the characteristics are caused.

EXAMPLE 3

Figure 5:
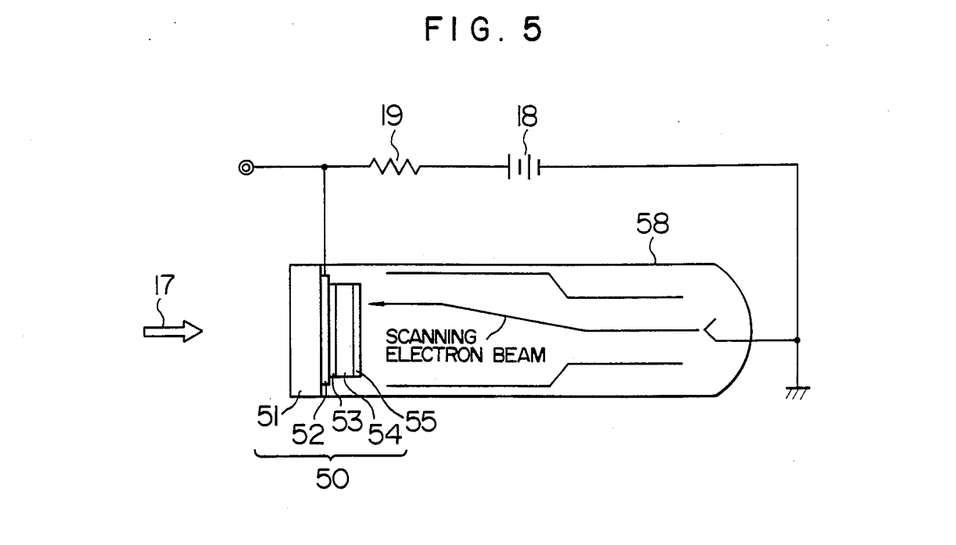
FIG. 5 is a scheme for explaining the structure of a image pick-up tube, which is another embodiment of the photoelectric conversion device according to this invention.

FIG. 5 shows the construction of an image pick-up tube, which is another embodiment of this invention. A transparent electrode 52 composed mainly of $In_2O_3$ is formed on a glass substrate 51. An a-Si:H having a layer thickness of 10 nm, doped with P at 50 ppm, is formed thereon as a hole blocking layer 53 by using $PH_4$ as doping gas. Then an a-Si:H having a layer thickness of 0.5-10 μm is deposited by the plasma CVD method by using $SiH_4$ as source gas so as to obtain a photoconductive layer 54. Then $Sb_2S_3$ is deposited to a layer thickness of 100 nm as an electron blocking layer 55 in an Ar atmosphere of 13.3 Pa ($10^{-1}$Torr). A target portion 50 of an image pick-up tube can be obtained by those described above from 51 to 55. An image pick-up tube is obtained by mounting this target portion 50 in a glass tube 58 and evacuating the glass tube 58.

EXAMPLE 4

An example, in which this invention is applied to an image pick-up tube, similarly to Example 3, is shown. In this example also Ge is used as the element belonging to tetrahedral system. In FIG. 5, a transparent electrode 52 composed mainly of $In_2O_3$ is formed on a glass substrate 51. An a-Si:H having a layer thickness of 10 nm, doped with P at 50 ppm, is formed thereon as a hole blocking layer 53 by using $PH_4$ as doping gas. Then an a-Ge:H having a layer thickness of 0.5-10 μm is formed by the plasma CVD method by using $GeH_4$ as source gas so as to obtain a photoconductive layer 54. Thereafter amorphous material composed of Se-As-Te is deposited to a layer thickness of 100 nm as an electron blocking layer 55 in an $N_2$ atmosphere of 13.3 Pa ($10^{-1}$Torr). An image pick-up tube is obtained by using an image pick-up tube target portion 50 thus obtained in the same way as in Example 3.

When an electric field higher than $8 \times 10^7$ V/m is applied to the photoconductive layer in the image pick-up tube in Example 3 or 4 so that the transparent electrode 52 is positive, it is possible to realize a high sensitivity with a photoconductive gain greater than 1 without impairing the photoresponse. Further it is confirmed that its characteristics are thermally stable. In the figure reference numeral 19 indicates a load resistance.

Now, several examples will be explained, in the case where the photoconductive layer composed of amorphous silicon carbide is formed as the amorphous semiconductor layer for charge multiplication. In the following examples amorphous silicon carbide (a-$Si_{1-x}C_x$:H) is formed by the plasma CVD method using $SiH_4$, $SiF_4$, etc. and $CH_4$, $C_2H_6$, $C_2H_4$, etc. as source gases or by the reactive sputtering method of Si in a gaseous medium of H, Ar, $CH_4$, etc. At this time, the concentration of carbon in the layer is controlled by regulating the flow rate of the source gas and the partial pressure of the gas of the atmosphere. Further, in the method described above, an n conductivity type a-SiC:H is obtained by adding a gaseous compound of an element of V family such as P, As, Sb, etc. and an p conductivity type a-SiC:H is obtained by adding a gaseous compound of an element of III family such as B, Al, etc.

EXAMPLE 5

Explanation will be made, referring to FIG. 1A.

A transparent electrode 16 composed mainly of iridium oxide is formed on a transparent substrate 11. An a-$Si_{70}C_{30}$:H having a layer thickness of 0.5-10 μm is formed thereon as a photoconductive layer 14 including amorphous semiconductor. An a-$Si_{50}C_{50}$:H doped with P at 50 ppm is formed further thereon to a thickness of 10 nm so as to form a hole blocking layer 13. A photoelectric conversion device is obtained by depositing an Al electrode further thereon as a counter electrode 12.

EXAMPLE 6

Figure 6:
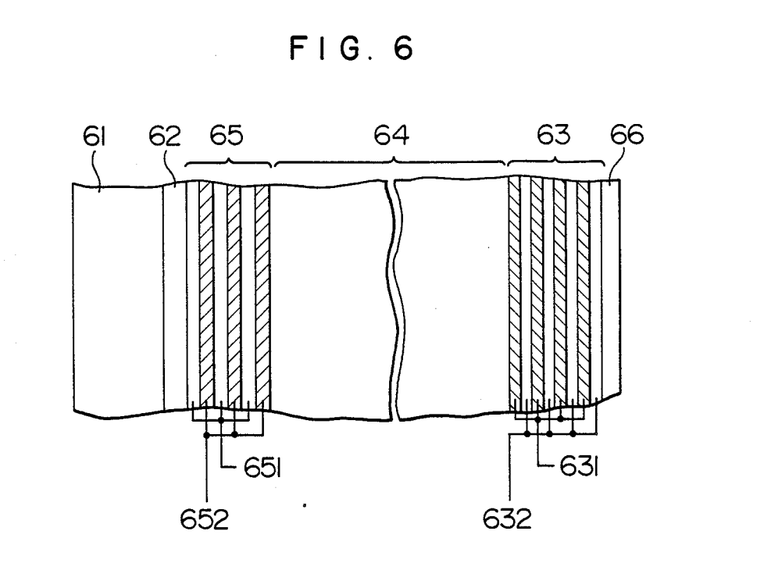
FIG. 6 is a scheme for explaining the structure of a photosensitive element, which is still another embodiment of the photoelectric conversion device according to this invention.

FIG. 6 shows the schematical construction of a light sensitive element, which is an embodiment of this invention. This light sensitive element is formed by depositing successively a transparent electrode 62 composed mainly of indium oxide, an electron blocking layer 65, a photoconductive layer 64, a hole blocking layer 63 and an Au electrode 66 on a transparent substrate 61. The electron blocking layer 65 consists of 3 layers 651 made of a-$Si_{60}C_{40}$:H and 3 layers 652 made of a-$Si_{70}C_{30}$:H doped with B at 10 ppm overlaid alternately on each other, each of the layers being 5 nm thick. The photoconductive layer 64 is a layer 2–8 μm thick and made of a-$Si_{80}C_{20}$:H doped with P at 50 ppm. The hole blocking layer 63 consists of 4 layers 631 made of a-$Si_{70}C_{30}$:H doped with As at 50 ppm and 4 layers 632 made of a-$Si_{50}C_{50}$:H overlaid alternately on each other, each of the layers being 2.5 nm thick. As described above, it is possible to a obtain carrier blocking layer made of a-SiC:H, with effective wide band gap and effective p or n conductivity type, having good characteristics, and having an excellent carrier blocking ability if it consists of undoped a-SiC:H layers having a wide band gap and doped a-SiC:H layers having a narrow band gap.

EXAMPLE 7

Figure 8A:
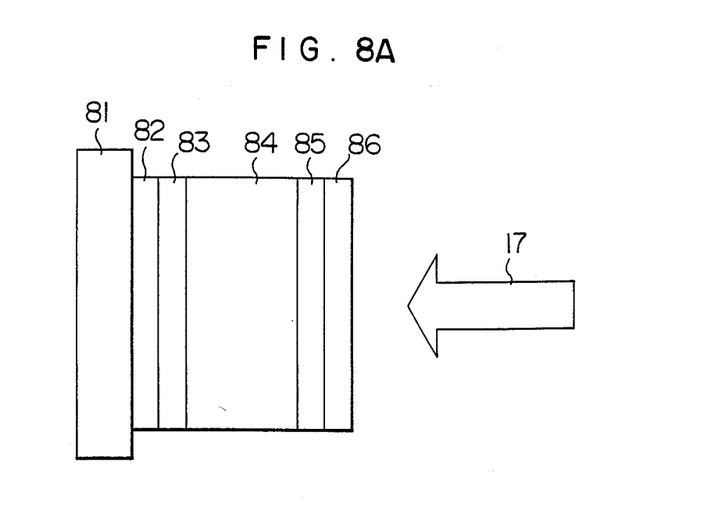
FIGS. 8A and 8B are schemes for explaining the structure of still another photosensitive element, which is still another embodiment of the photoelectric conversion device according to this invention.

Explanation will be made, referring to FIG. 8A.

An electrode 82 composed mainly of Cr is formed on a semi-insulating semiconductor substrate 81. a-SiN:H is deposited thereon to a layer thickness of 10 nm as a hole blocking layer 83. Then a-$Si_{80}C_{20}$:H is deposited thereon to a layer thickness of 0.5-10 μm as a photoconductive layer 84. Thereafter a thin layer made of silicon oxide is deposited thereon to a layer thickness of 8 nm as an electron blocking layer 85. A photoelectric conversion device can be obtained by forming a transparent electrode 86 composed mainly of tin oxide further thereon.

EXAMPLE 8

Figure 7A:
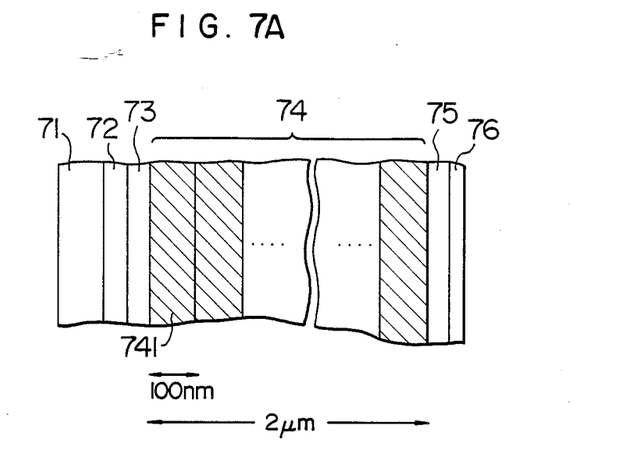
FIGS. 7A and 7B are schemes for explaining the structure of another photosensitive element, which is still another embodiment of the photoelectric conversion device according to this invention.
Figure 7B:
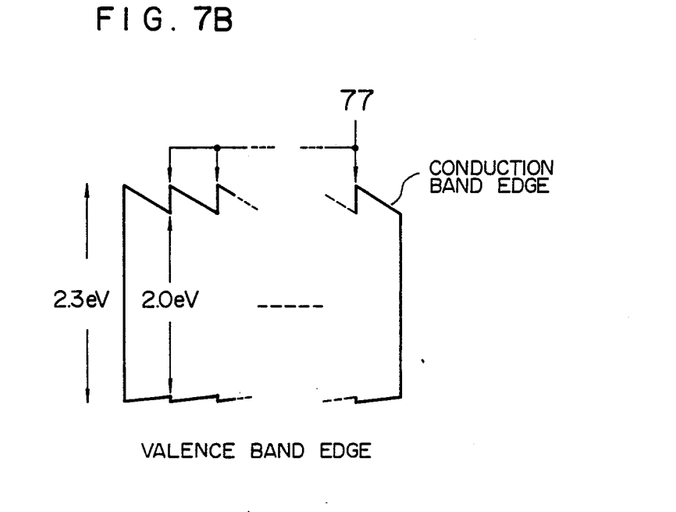

FIG. 7A indicates a schematical construction of a light sensitive element, which is still another embodiment of this invention. The overall construction is identical to that indicated in FIG. 1B. This element consists of an electrode 72 composed mainly of Ta, a hole blocking layer 73, an amorphous semiconductor layer 74, an electron blocking layer 75, and a transparent electrode 76 successively formed on an arbitrary substrate 71. The hole blocking layer 73 is made of $CeO_2$ having a layer thickness of 10 nm and the electron blocking layer 75 is made of a-$Si_{70}C_{30}$:H doped with B at 100 ppm and having a layer thickness of 10 nm. The amorphous semiconductor layer 74 is a layer 2 μm thick made of a-SiC:H. At this time a first portion 741 which is 100 nm thick is so formed that the C concentration in the layer decreases from 35% to 10%. This operation being considered to be one period, the amorphous semiconductor layer 74 is completed by repeating similar operations (by about 20 periods). As a result, as indicated in FIG. 7B, the band gap varies from 2.3 eV to 2.0 eV with a period of 100 nm. In this case, at the discontinuous portions 77 of the band gap its value varies significantly. However, if the band gap is varied by varying the composition of the compound consisting of Si and carbon as in this example, almost all the difference of the band gap at the discontinuous portions 77 is attributable to displacement of the conduction band edge. Consequently, in the case where this element is used under the condition in which the transparent electrode is negatively biased, traveling electrons gain energy corresponding to the energy difference of the conduction band edge, when they pass through the discontinuous portions 77 of the forbidden band width and thus it is possible to increase the effective electron multiplication factor with respect to that obtained in the case where the band gap is continuous.

EXAMPLE 9

Figure 8B:
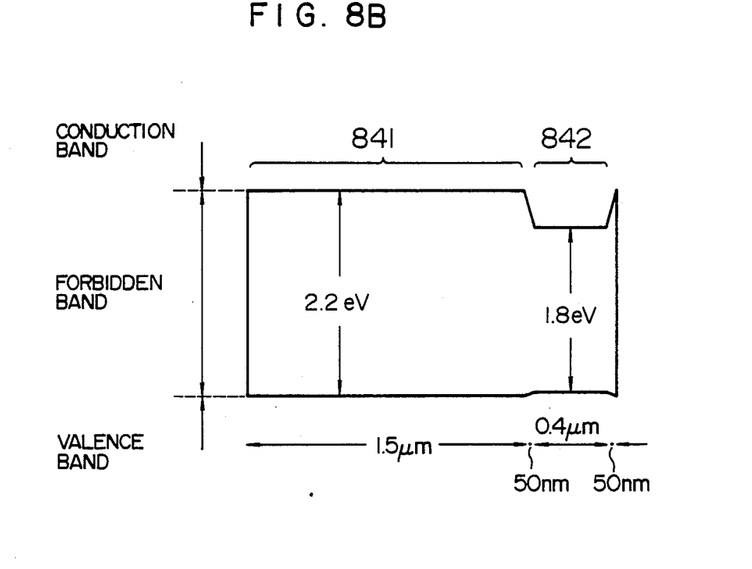

Explanation will be made by referring to FIGS. 8A and 8B.

An electrode 82 composed mainly of n+ conductivity type crystalline Si is formed on a semiinsulating semiconductor substrate 81. A hole blocking layer 83 made of a-$Si_{70}C_{30}$:H doped with P at 100 ppm is deposited thereon to a layer thickness of 5 nm. Then an amorphous semiconductor layer 84, 0.6-10 μm thick and composed mainly of a-SiC:H and comprised of 841 and 842 is formed further thereon. At this time portion 842, where the band gap is small, is disposed within the amorphous semiconductor layer by controlling the C concentration in the layer. For example, the C concentration in the layer is so controlled that it is 30 at. % in the first portion 841, 1.5 μm thick; it is decreased from 30 at. % to 0% in the succeeding portion 50 nm thick; it is constant at 0% in the succeeding portion 0.5 μm thick; and finally it is increased continuously from 0% to 30 at. % in the succeeding portion 50 nm thick. As a result, the forbidden band width is so shaped that it is 2.2 eV at the portion 841 where the C concentration is 30 at. % and 1.8 eV at the portion 842 where the C concentration is 0%, as shown in FIG. 8B. Therefore, the forbidden band width has a shape, as principally conduction band edge is narrowed. After that, an electron blocking layer 85, 10 nm thick and made of a-$Si_{70}C_{30}$:H doped with B at 100 ppm is formed further thereon. A transparent electrode 86 composed mainly of tin oxide is formed further thereon so as to obtain a photoelectric conversion device. The efficiency of the photoelectric conversion is increased especially by light having long wavelengths for adopting this structure so that the portion 842 having a narrow band gap absorbs incident light 17 with a high efficiency. In addition, in this way, since the charge generation layer and the charge multiplication layer are substantially separated, it is possible to suppress noise generation accompanied by the charge multiplication.

When an electric field higher than $5 \times 10^7$ V/m is applied to a photoelectric conversion device described in one of the Example 5 to 9, it is possible to realize a high sensitivity with a photoconductive gain greater than 1 without impairing the photoresponse. Further no variations in characteristics are caused, even if they are operated continuously for a long time at a temperature of 80° C.

What is claimed is:

1. A photoelectric conversion device comprising:
    a substrate;
    a first electrode formed on said substrate;
    a photoconductive layer for converting incident light into carriers, being formed on said first electrode, and having an amorphous semiconductor layer which is made of at least one first element belonging to tetrahedral system and which contains at least one second element selected from the group consisting of hydrogen and halogens;
    means for applying an electric field to said photoconductive layer through the first electrode, so as to make said carriers run through said photoconductive layer and to multiply said carriers in said amorphous semiconductor layer under the electric filed; and
    a blocking structure for blocking charge injection from the first electrode into the photoconductive layer under said electric field applied by said means for applying the electric field, so as to obtain said carrier as signals.

2. A photoelectric conversion device as claimed in claim 1, wherein the substrate is transparent, the first electrode is transparent and has a thickness not greater than 300 nm; the blocking structure includes a blocking layer between the first electrode and photoconductive layer and having a thickness of 5 to 500 nm; and the photoconductive layer has a thickness of 0.5 to 10 μm.

3. A photoelectric conversion device as claimed in claim 2, wherein the device further includes a further blocking layer on the photoconductive layer, on a side thereof not adjacent the blocking layer, and wherein the further blocking layer has a thickness of 5 to 500 nm.

4. A photoelectric conversion device as claimed in claim 1, said device being a blocking device wherein charge injection from electrodes of the device, into the photoconductive layer, is blocked.

5. A photoelectric conversion device as claimed in claim 1, wherein the amorphous semiconductor layer has such a thickness, and the means for applying an electric field can apply an electric field in a direction, such that said carriers run through the amorphous semiconductor layer and multiply said carriers therein.

6. A photoelectric conversion device comprising:
    a photoconductive layer for converting incident light into carriers, having an amorphous semiconductor layer which is made of a first element belonging to tetrahedral system and which contains a second element selected from a group consisting of hydrogen and halogens;
    a first electrode;
    means for applying an electric field to the photoconductive layer through the first electrode so as to make the carriers run through the photoconductive layer and so that the carriers multiply in the amorphous semiconductor layer under the electric field; and
    a blocking structure for blocking charge injection from the first electrode into the photoconductive layer under said electric field applied by said means for applying the electric field, so as to obtain the carriers as signals.

7. A photoelectric conversion device as claimed in claim 6, wherein said amorphous semiconductor layer is made of silicon.

8. A photoelectric conversion device as claimed in claim 6, wherein said amorphous semiconductor layer is made of silicon carbide.

9. A photoelectric conversion device as claimed in claim 8, wherein the composition ratio of carbon in said silicon carbide is 5 to 50 atomic %.

10. A photoelectric conversion device as claimed in claim 6, wherein said substrate and said first electrode are transparent.

11. A photoelectric conversion device as claimed in claim 6, wherein said tetrahedral system is made of a material selected from the group consisting of carbon, silicon, germanium and tin.

12. A photoelectric conversion device as claimed in claim 6, wherein said halogens are fluorine, chlorine, bromine and iodine.

13. A photoelectric conversion device as claimed in claim 6, wherein said blocking structure includes a first blocking layer, formed between said first electrode and said photoconductive layer.

14. A photoelectric conversion device as claimed in claim 13, wherein a second blocking layer is formed on said photoconductive layer, on the side thereof furthest from the first blocking layer.

15. A photoelectric conversion device as claimed in claim 14, wherein a second electrode is formed on said second blocking layer.

16. A photoelectric conversion device as claimed in claim 14, wherein each of the first and second blocking layers include a plurality of sub-layers.

17. A photoelectric conversion device as claimed in claim 16, wherein the plurality of sub-layers of the first blocking layer are alternately undoped a-SiC:H having a wide band gap and p-conductivity type a-SiC:H having a narrow band gap; and wherein the plurality of sub-layers of the second blocking layer are alternately undoped a-SiC:H having a wide band gap and n-conductivity type a-SiC:H having a narrow band gap.

18. A photoelectric conversion device as claimed in claim 6, wherein the photoelectric conversion device is adapted to have incident light irradiated on one side thereof, wherein said means for applying an electric field applies it to said photoconductive layer so that the side to which the incident light is projected is at a negative potential.

19. A photoelectric conversion device comprising:
a substrate;
a first electrode formed on said substrate;
a photoconductive layer for converting incident light into carriers, being formed on said first electrode, and having an amorphous semiconductor layer which is made of silicon carbide and which contains at least one second element selected from the group consisting of hydrogen and halogens, the photoconductive layer including a pn-junction therein;
means for applying an electric field to said photoconductive layer through the first electrode, so as to make said carriers run through said photoconductive layer and to multiply said carriers in said semiconductor layer under said electric field; and
a blocking structure for blocking charge injection from the first electrode into the photoconductive layer under said electric field applied by said means for applying the electric field, so as to obtain said carrier as signals.

20. A photoelectric conversion device as claimed in claim 6, wherein the amorphous semiconductor layer has a thickness of 0.5 to 10 μm.

21. A photoelectric conversion device as claimed in claim 6, wherein the device includes a second electrode which, with the first electrode, sandwiches the photoconductive layer.

22. A photoelectric conversion device as claimed in claim 6, wherein the amorphous semiconductor layer has a forbidden band width greater than 1.85 eV.

23. A photoelectric conversion device as claimed in claim 22, wherein the amorphous semiconductor layer has a thickness of 0.5 to 10 μm.

24. A photoelectric conversion device as claimed in claim 6, wherein the content of the second element is 0.5–30 atomic %.

25. A photoelectric conversion device as claimed in claim 6, wherein the amorphous semiconductor layer also contains elements of Group III or of Group V of the Periodic Table.

26. A photoelectric conversion device as claimed in claim 6, wherein the blocking structure includes one of the first and second blocking layers, with one of the first and second blocking layers being a hole blocking layer, and the other of the first and second blocking layers being an electron blocking layer.

27. A photoelectric conversion device as claimed in claim 26, wherein the blocking structure includes the hole blocking layer, and wherein the hole blocking layer is at least one sub-layer of amorphous silicon carbide or silicon nitride containing at least one selected from the group consisting of hydrogen and halogens, and also containing or not containing a Group V element of the Periodic Table so as to provide an n-conductivity type sub-layer.

28. A photoelectric conversion device as claimed in claim 26, wherein the blocking structure includes the hole blocking layer, and wherein the hole blocking layer is at least one sub-layer of a material of an oxide of at least one of Ce, Ge, Zn, Cd, Al, Nb, Ta, Cr and W.

29. A photoelectric conversion device as claimed in claim 26, wherein the blocking structure includes the electron blocking layer, and wherein the electron blocking layer is at least one sub-layer of amorphous silicon carbide or silicon nitride containing at least one selected from the group consisting of hydrogen and halogens, and also containing or not containing a Group III element of the Periodic Table so as to provide a p-conductivity type sub-layer.

30. A photoelectric conversion device as claimed in claim 26, wherein the blocking structure includes the electron blocking layer, and wherein the electron blocking layer is at least one sub-layer of a material selected from the group consisting of an oxide of Ir, and chalcogenides.

31. A photoelectric conversion device as claimed in claim 6, wherein the amorphous semiconductor layer has a portion which has a smaller band gap than that of another portion of the amorphous semiconductor layer.

32. A photoelectric conversion device comprising:
a photoconductive layer for converting incident light into carriers, having an amorphous semiconductor layer which is made of a first element belonging to tetrahedral system and which contains a second element selected from a group consisting of hydrogen and halogens, wherein said photoconductive layer is made of a plurality of semiconductor layers;
a first electrode;
means for applying an electric field to the photoconductive layer through the first electrode so that the amorphous semiconductor layer multiplies the carriers under the electric field; and
a blocking structure for blocking carriers from the first electrode into the photoconductive layer.

33. A photoelectric conversion device comprising:
a photoconductive layer for converting incident light into carriers, having an amorphous semiconductor layer which is made of a first element belonging to tetrahedral system and which contains a second element selected from a group consisting of hydrogen and halogens, wherein the amorphous semiconductor layer has portions where the band gap varies discontinuously;

a first electrode;

means for applying an electric field to the photoconductive layer through the first electrode so that the amorphous semiconductor layer multiplies the carriers under the electric field; and a blocking structure for blocking carriers from the first electrode into the photoconductive layer.

34. A photoelectric conversion device comprising:

a photoconductive layer for converting incident light into carriers, having a plurality of amorphous semiconductor layers which are made of a first element belonging to tetrahedral system and which contains a second element selected from a group consisting of hydrogen and halogens, wherein the plurality of amorphous semiconductor layers each are made of a compound of silicon and carbon and contain an element selected from a group consisting of hydrogen and halogens, and each amorphous semiconductor layer has a region in which the carbon concentration is changed so that a band gap of the amorphous semiconductor layer varies;

a first electrode;

means for applying an electric field to the photoconductive layer through the first electrode so that the amorphous semiconductor layer multiplies the carriers under the electric field; and a blocking structure for blocking carriers from the first electrode into the photoconductive layer.

35. A photoelectric conversion device as claimed in claim 19, said device being a blocking device wherein charge injection from electrodes of the device, into the photoconductive layer, is blocked.

36. A photoelectric conversion device as claimed in claim 6, said device being a blocking device wherein charge injection from electrodes of the device, into the photoconductive layer, is blocked.

37. A photoelectric conversion device as claimed in claim 19, wherein the amorphous semiconductor layer has such a thickness, and the means for applying an electric field can apply an electric field in a direction, such that said carriers run through the amorphous semiconductor layer and multiply said carriers therein.

38. A photoelectric conversion device as claimed in claim 6, wherein the amorphous semiconductor layer has such thickness, and the means for applying an electric field can apply an electric field in a direction, such that said carriers run through the amorphous semiconductor layer and multiply said carriers therein.

39. A photoelectric conversion device comprising:

a photoconductive layer for converting incident light into carriers, having an amorphous semiconductor layer which is made of a first element belonging to tetrahedral system and which contains a second element selected from a group consisting of hydrogen and halogens, wherein said photoconductive layer is made of a plurality of semiconductor layers, and wherein said photoconductive layer has a crystal semiconductor layer, said amorphous semiconductor layer being formed on the crystal semiconductor layer;

a first electrode;

means for applying an electric field to the photoconductive layer through the first electrode so that the amorphous semiconductor layer multiples the carriers under the electric field; and a blocking structure for blocking carriers from the first electrode into the photoconductive layer.

40. A photoelectric conversion device as claimed in claim 39, wherein said crystal semiconductor layer is made of silicon.

41. A photoelectric conversion device comprising:

a photoconductive layer, for converting incident light into carriers, having an amorphous semiconductor layer which is made of a compound of silicon and carbon and which contains an element selected from a group consisting of hydrogen and halogens, and wherein the photoconductive layer includes a pn-junction therein;

a first electrode;

means for applying an electric field to the photoconductive layer through the first electrode so as to make the carriers run through the photoconductive layer and so that the carriers are multiplied in the photoconductive layer under the electric field; and a blocking structure for blocking charge injection from the first electrode into the photoconductive layer under said electric field applied by the means for applying the electric field, so as to obtain said carrier as signals.

* * * * *